United States Patent
Lin et al.

(10) Patent No.: US 6,363,016 B1
(45) Date of Patent: Mar. 26, 2002

(54) METHOD FOR ENHANCEMENT OF NON-VOLATILE MEMORY CELL READ CURRENT

(75) Inventors: Qi Lin, Cupertino; Anders T. Dejenfelt, Palo Alto, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/687,479

(22) Filed: Oct. 12, 2000

(51) Int. Cl.$^7$ ................................................. G11C 16/04
(52) U.S. Cl. ............................... 365/185.27; 365/185.18
(58) Field of Search ......................... 365/185.27, 185.18

(56) References Cited

U.S. PATENT DOCUMENTS

| | | | | |
|---|---|---|---|---|
| 5,379,253 A | * | 1/1995 | Bergemont | .................. 365/185 |
| 6,137,727 A | * | 10/2000 | Cleveland | ............... 365/185.27 |
| 6,147,907 A | * | 11/2000 | Thurgate | ............... 365/185.18 |

OTHER PUBLICATIONS

"A Dynamic Threshold Voltage MOSFET (DTMOS) For Ultra–Low Voltage Operation"; Assaderaghi et al.; 1994 IEEE; pp. 33.1.1–33.1.1.4.

* cited by examiner

Primary Examiner—A. Zarabian
(74) Attorney, Agent, or Firm—E. Eric Hoffman; Jeanette S. Harms, ESQ (57) ABSTRACT

A method is provided to increase the speed of a non-volatile memory transistor by increasing the read channel current in the non-volatile memory transistor. This increase in speed is accomplished without increasing the $V_{CC}$ voltage supply source or decreasing the channel length of the non-volatile memory transistor. The increase in read channel current is accomplished by applying a low voltage to the substrate region of the non-volatile memory transistor, while grounding the source of the non-volatile memory transistor. If the non-volatile memory transistor is located in an array, the low voltage is applied to the sources and drains of non-volatile memory transistors on unselected bit lines to inhibit junction leakage channel current from these unselected non-volatile memory transistors.

9 Claims, 6 Drawing Sheets

METHOD FOR ENHANCEMENT OF NON-VOLATILE MEMORY CELL READ CURRENT

FIELD OF THE INVENTION

The present invention relates to non-volatile memory devices, such as electrically or ultra-violet erasable and electrically programmable memory cells, and particularly to a method for increasing read current in non-volatile memory devices.

DISCUSSION OF RELATED ART

An electrically erasable and programmable read-only memory (EEPROM) cell or a UV erasable and electrically programmable read-only memory (EPROM) cell consists of a single transistor incorporating a floating gate (1T cell). For programmable logic applications, an EEPROM cell can include both an access transistor and a floating gate storage transistor. In general, EPROM cells and EEPROM cells will be referred to as non-volatile memory cells (or transistors). In many memory and programmable logic applications, both complementary-symmetry metal-oxide-semiconductor (CMOS) transistors and non-volatile memory cells are used.

Advances in technology demand increased performance in smaller packages. As a result, a trend has emerged towards scaling down components. Such scaling includes a reduction in power consumed by the components as well as a physical reduction in component size. Historically, the minimum feature sizes of transistors have been scaled down from 0.5 microns, to 0.35 microns to 0.25 microns to 0.18 microns. It is expected that this trend will continue to provide sub-0.18 micron transistors.

To scale down CMOS transistors, scaling is performed in both the vertical dimension and the horizontal dimensions. To scale down a CMOS transistor in the vertical dimension, the gate oxide thickness is reduced. Thus, for 0.5, 0.35, 0.25 and 0.18 micron processes, CMOS gate oxide thickness are 120, 70, 50, and 30 Angstroms, respectively. To scale down a CMOS transistor in the horizontal dimensions, both the length and width of the transistors must shrink proportionally. If the CMOS transistor channel length is reduced without reducing the gate oxide thickness, the CMOS transistor will exhibit punch through. Punch through occurs when the source depletion layer and the drain depletion layer touch each other. As the minimum feature size of transistors is scaled down, a reduction in the nominal operating voltage (i.e., the $V_{CC}$ supply voltage) is required. For example, for 0.5, 0.35, 0.25 and 0.18 micron technologies, the nominal $V_{CC}$ supply voltages have been 5 Volts, 3.3 Volts, 2.5 Volts and 1.8 Volts, respectively.

In CMOS transistors, power is proportional to both the $V_{CC}$ supply voltage and channel current. Because transistor speed directly depends on the channel current, most efforts for reducing power in devices utilizing CMOS transistors focus on power supply scaling. Scaling down the $V_{CC}$ power supply voltage causes the speed of a scaled down transistor to stay the same or increase, but proportionally reduces power consumption.

Non-volatile memory cells cannot be scaled down by the same factor as CMOS transistors. More specifically, the vertical dimensions of a non-volatile memory cell cannot be scaled down by the same factor, because the thickness of the tunneling oxide and the thickness of the insulation layer between the floating gate and the control gate must be maintained for purposes of data retention and endurance. Because the vertical dimensions of the non-volatile memory cell cannot be significantly reduced, the horizontal dimensions (i.e., the cell channel) cannot be significantly reduced.

The read channel current in a non-volatile memory transistor is defined as the current through the non-volatile memory transistor during a read operation. The read channel current in a non-volatile memory transistor is proportional to the square of the $V_{CC}$ supply voltage divided by the channel length. A reduction in the $V_{CC}$ supply voltage without a corresponding reduction in the channel length of the non-volatile memory transistor results in a lowered read channel current. The lower read channel current causes a significant degradation of the speed of a non-volatile memory transistor.

It would be desirable to increase the channel current in a non-volatile memory transistor that is operating at a reduced $V_{CC}$ voltage supply source without providing a corresponding reduction in transistor channel length.

Current methods for increasing the read channel current in non-volatile memory transistors include increasing the gate voltage, increasing the drain voltage, and increasing the coupling ratio of the non-volatile memory transistor.

The first method for increasing channel current during a read operation involves increasing the voltage applied to the gate of the non-volatile memory transistor. As described above, the cause of the lowered channel current is the lowered $V_{CC}$ voltage supply source. During a read operation, this $V_{CC}$ voltage supply source may be pumped to a larger voltage, thereby increasing the voltage applied to the gate of the non-volatile memory transistor. However, the use of a charge pump requires additional delay required to pump up the gate voltage and also requires additional space on the integrated circuit for the charge pump circuitry.

The second method for increasing channel current during a read operation involves increasing the voltage applied to the drain of the non-volatile memory transistor. The channel current is proportional to the electrical field between the source and the drain. Therefore, increasing the drain voltage causes the electrical field to increase, thereby increasing the channel current. However, the increased voltage on the drain causes an increase in read disturb of the non-volatile memory transistor. Read disturb occurs when read conditions cause hot electron injection from the channel region into the floating gate, thereby disturbing the contents of the non-volatile memory transistor. This read disturb typically limits the maximum drain voltage applied to the non-volatile memory transistor during a read operation to less than 2.0 Volts.

The third method of increasing the channel current during a read operation is to increase the coupling ratio between the control gate and the floating gate of the non-volatile memory transistor. The voltage of the floating gate controls the channel current during a read operation. This voltage on the floating gate is a function of the coupling ratio of the non-volatile memory transistor. The coupling ratio is proportional to the relative areas of the control gate and the floating gate. The coupling ratio is the percentage of the voltage applied to the control gate (i.e. the $V_{CC}$ voltage supply source) that is transmitted to the floating gate. However, to increase the coupling ratio of a non-volatile memory transistor, the cell size of the non-volatile memory transistor has to increase, thereby requiring more space on the integrated circuit.

As described above, current methods for increasing read channel current in non-volatile memory transistors operating at a lowered voltage require a larger cell size or increase the possibility of read disturb. It would be desirable to increase the read channel current in a non-volatile memory transistor without more space on the integrated circuit or increasing the possibility of read disturb.

SUMMARY OF THE INVENTION

Accordingly, the present invention describes a method to increase the speed of a non-volatile memory transistor by increasing the read channel current in the non-volatile memory transistor. This increase in speed is accomplished without increasing the $V_{CC}$ voltage supply source or decreasing the channel length of the non-volatile memory transistor.

The increase in read channel current is accomplished by applying a low voltage to the substrate region of the non-volatile memory transistor, while grounding the source of the non-volatile memory transistor. If the non-volatile memory transistor is located in an array, the low voltage is applied to the source and drain of non-volatile memory transistors on unselected bit lines to inhibit junction leakage current from these unselected non-volatile memory transistors.

The design can be simplified by applying zero Volts to the source and drain of non-volatile memory transistors on unselected bit lines. However, this will result in higher substrate leakage.

The present invention will be more fully understood in view of the following description and drawings.

DETAILED DESCRIPTION OF THE INVENTION

Figure 1:
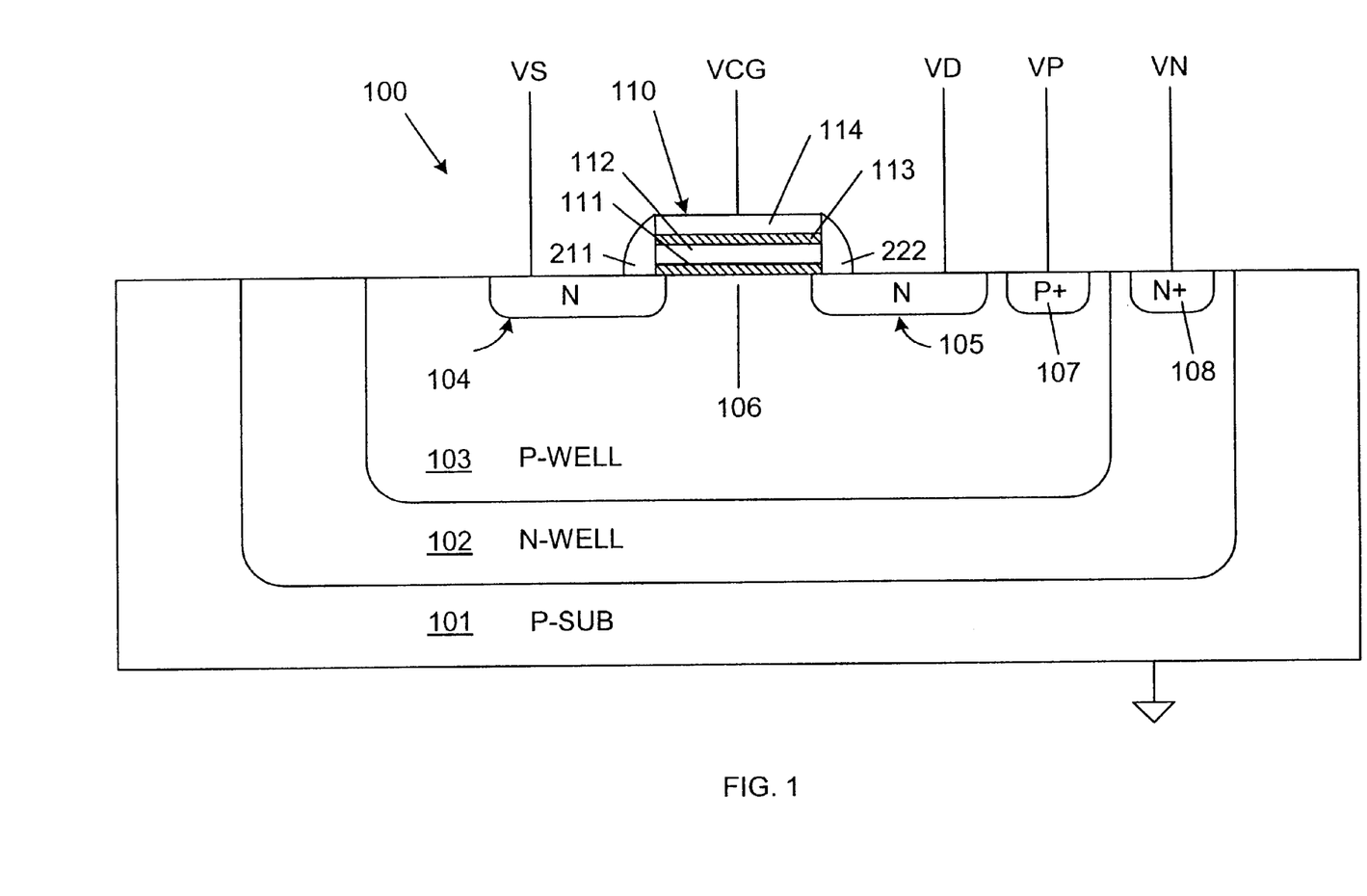
FIG. 1 is a cross sectional view of an n-channel non-volatile memory transistor, which is biased in accordance with one embodiment of the present invention.

FIG. 1 is a cross sectional view of an n-channel non-volatile memory transistor 100, which is biased in accordance with one embodiment of the present invention. Non-volatile memory transistor 100 includes p-type substrate 101, n-well 102, p-well 103, N-type source region 104, N-type drain region 105, channel region 106, P+contact region 107, N+contact region 108, gate electrode 110 and sidewall spacers 121–122. P-type channel region 106 is located between regions 104 and 105. P+contact region 107 is formed in p-well 103, and N+contact region 108 is formed in n-well 102. Gate electrode 110 includes tunnel oxide layer 111, floating gate 112, oxide-nitride-oxide (ONO) layer 113 and control gate 114.

The channel current (I) of non-volatile memory transistor 100 is defined by Equation (1) below.

$$I = k \frac{w}{L} \frac{\varepsilon_o}{t_{ox}} (V_{CC} - V_t)^2 \qquad (1)$$

In Equation (1), k is a constant, w is the channel width of transistor 100, L is the channel length of transistor 100, $\varepsilon_o$ is the permittivity of channel region 106, $t_{ox}$ is the thickness of tunnel oxide layer 111, $V_{CC}$ is the supply voltage, and $V_t$ is the threshold voltage of transistor 100.

As shown in Equation (1), the channel current (I) can be increased by minimizing the threshold voltage $V_t$ of transistor 100. Therefore, the channel current can be maximized during a read operation by minimizing the dynamic threshold voltage $V_t$ during a read operation. Equation (2) defines the factors affecting the threshold voltage $V_t$.

$$V_t = V_{t0} + \gamma \sqrt{2\phi_p - V_{BS}} \qquad (2)$$

In Equation (2), $V_{t0}$ is the initial threshold voltage of transistor 100, $\gamma$ is the body effect, $\phi_p$ is potential in the p-type semiconductor, and $V_{BS}$ is the voltage between p-well 103 (body) and source region 104. As shown by Equation (2), the threshold voltage $V_t$ can be minimized by causing $V_{BS}$ to approach $2\phi_p$.

Body effect $\gamma$ is defined by Equation (3).

$$\gamma = \frac{t_{OX} \sqrt{2\varepsilon_s q N_A}}{\varepsilon_o} \qquad (3)$$

In Equation (3), $t_{ox}$ is the thickness of tunnel oxide layer 111, $\varepsilon_o$ is the permittivity of tunnel oxide layer 111, $\varepsilon_s$ is the permittivity of p-well 103, q is elementary charge (i.e. the charge carried by a single electron) stored by floating gate 112 and $N_A$ is doping concentration of channel region 106. As defined by Equation (3), the magnitude of the body effect $\gamma$ is directly proportional to the thickness of tunnel oxide layer 111. Thus, as the thickness of tunnel oxide layer 111 increases, the body effect similarly increases. For example, in a particular embodiment, tunnel oxide layer 111 has a thickness of 0.1 nm and transistor 100 has a body effect of 0.5 $V^{1/2}$.

In accordance with the present invention, the $V_{BS}$ voltage between p-well 103 and source region 104 is maximized during a read operation by grounding source region 104 and applying a positive voltage (e.g., 0.7 Volts) to p-well 103. Under these conditions, the $V_{BS}$ voltage between source region 104 and p-well 103 has a magnitude of 0.7 volts. In a particular embodiment, $\phi_p$ has a value of 0.35. Under these conditions, the radical in Equation (2) has a value of 0 Volts. A body effect of 0.5 and an initial threshold voltage $V_{t0}$ of 0.58 Volts produces a dynamic threshold voltage $V_t$ equal to 0.58 Volts. This is significantly less than the threshold voltage $V_t$ of 1.0 Volt, which would result if $V_{BS}$ were equal to 0 Volts. As illustrated by Equation (1), the lower threshold voltage $V_t$ advantageously results in a higher channel current (I), without requiring a change in channel length or width.

Note that Equation (2) defines the threshold voltage $V_t$ as seen from the first polysilicon (poly1) layer. For a non-volatile memory cell having a second polysilicon (poly2) layer, the threshold voltage $V_t$ as seen from the poly2 layer is approximated by:

$$V_t(\text{poly2}) = V_t(\text{poly1})/\alpha,$$

where $\alpha$ is the coupling ratio. In the above example, if the coupling ratio is 0.6, then $V_t(\text{poly1})=1.0$ Volt and $V_t(\text{poly2})=1.67$ Volt when $V_{BS}$ is equal to 0 Volts. With $V_{BS}=0.7$ Volt, $V_t(\text{poly1})=0.58$ Volt and $V_t(\text{poly2})=0.97$ Volt. Therefore, applying $V_{BS}$ of 0.7 Volts can impact the threshold voltage $V_t$ and read current of a non-volatile memory cell having both poly1 and poly2 layers more than a CMOS transistor or a non-volatile memory cell having only a poly1 layer.

Figure 2:
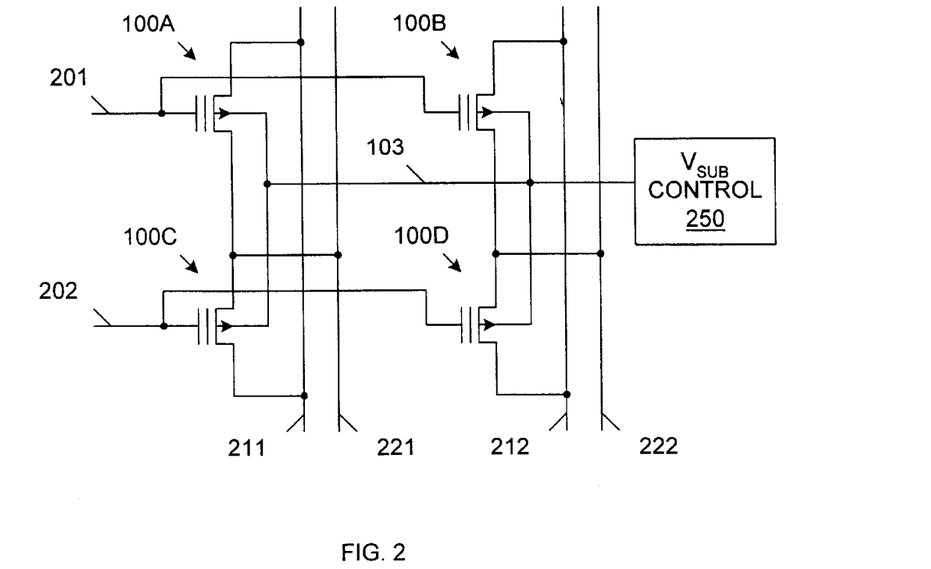
FIG. 2 is a circuit diagram of a 2×2 array of non-volatile memory transistors, each of which is identical to the non-volatile memory transistor of FIG. 1.

FIG. 2 is a circuit diagram of a 2×2 array of non-volatile memory transistors 100A, 100B, 100C and 100D, each of which is identical to non-volatile memory transistor 100 (FIG. 1). In the described embodiment, all of non-volatile memory transistors 100A–100D are located in the same p-well 103. Although a 2×2 array is described, one of ordinary skill can easily expand this array to have other sizes in view of the following disclosure. The array includes word line 201, which is coupled to the control gates of transistors 100A and 100B, and word line 202, which is coupled to the control gates of transistors 100C and 100D. The array further includes a first source bit line 211 that is coupled to the sources of transistors 100A and 100C, and a second source bit line 212 that is coupled to the sources of transistors 100B and 100D. The array additionally includes a first drain bit line 221, that is coupled to the drains of transistors 100A and 100C, and a second drain bit line 222, which is coupled to the drains of transistors 100B and 100D. A $V_{sub}$ control circuit 250 is coupled to p-well 103.

To read the contents of non-volatile memory transistor 100A, a read voltage equal to the $V_{CC}$ supply voltage is applied to word line 201, the drain bit line 221 is held at 1.5 Volts and the source bit line 211 is grounded. In addition, $V_{sub}$ control circuit applies a voltage of 0.7 Volts to p-well 103. Under these conditions, read current will flow through transistor 100A if this transistor is erased (i.e., stores no negative charge on floating gate 112). Conversely, no read current will flow if transistor 100A is programmed (i.e., stores negative charge on floating gate 112). As described above, applying a voltage of 0.7 Volts to p-well 103 advantageously increases read current through transistor 100A.

Also during a read of non-volatile memory transistor 100A, a voltage of 0 Volts is applied to word line 202. As a result, non-volatile memory transistors 100C and 100D are turned off, such that these transistors are not subjected to read conditions.

Also during a read of non-volatile memory transistor 100A, the unselected source bit line 212 and unselected drain bit line 222 receive the same 0.7 Volt pulse that is applied to p-well 103. As a result, the source and drain junctions of the memory cells in an unselected column have zero bias, thereby preventing source/drain junction leakage current in the unselected non-volatile memory transistors 100B and 100D. Because the source and drain of non-volatile memory transistor 100B are held at the same voltage, this transistor 100B is not subjected to a read (or disturb) condition.

Figure 3:
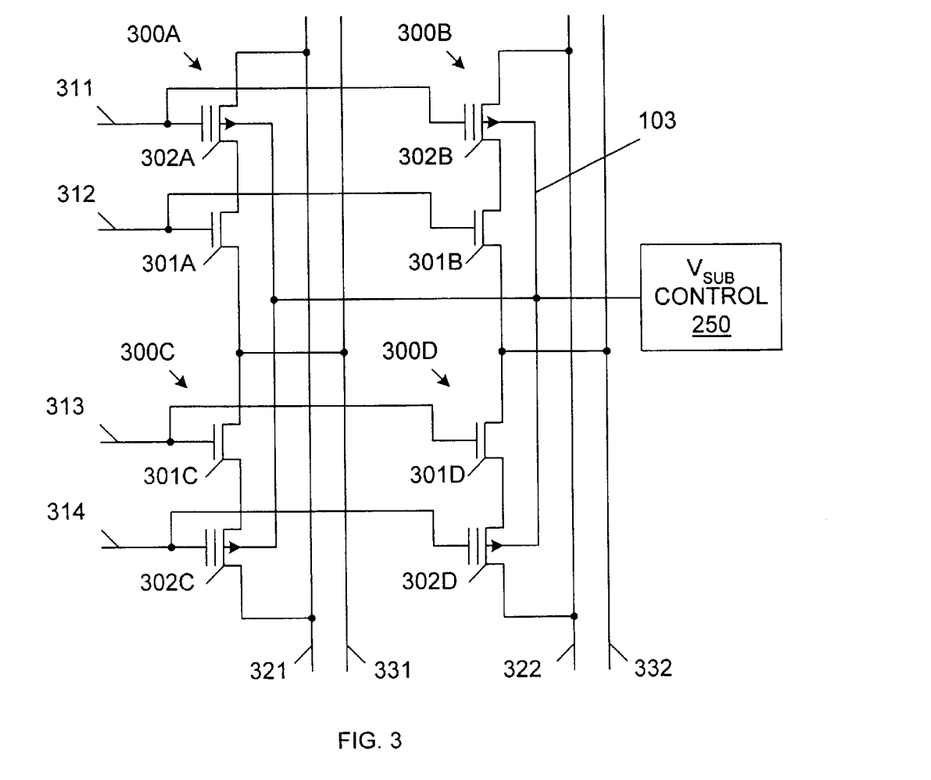
FIG. 3 is a circuit diagram of a 2×2 array of two-transistor non-volatile memory cells, which are biased in accordance with another embodiment of the present invention.

The present invention can also be practiced using two-transistor non-volatile memory cells. FIG. 3 is a circuit diagram of a 2×2 array of two-transistor non-volatile memory cells 300A–300D used in another embodiment of the present invention. Each of non-volatile memory cells 300A–300D includes an access transistor 301A–301D and a storage (floating gate) transistor 302A–302D. Each of storage transistors 302A–302D is substantially identical to non-volatile memory transistor 100 (FIG. 1). In the described embodiment, all of non-volatile memory cells 300A–300D are located in the same p-well 103. Although a 2×2 array is described, one of ordinary skill can easily expand this array to have other sizes in view of the following disclosure. The array includes word line 311, which is coupled to the control gates of storage transistors 302A and 302B; word line 312, which is coupled to the gates of access transistors 301A and 301B; word line 313, which is coupled to the gates of access transistors 301C and 301D; and word line 314, which is coupled to the control gates of storage transistors 302C and 302D. The array further includes a first source bit line 321 that is coupled to the sources of storage transistors 302A and 302C, and a second source bit line 322 that is coupled to the sources of storage transistors 302B and 302D. The array additionally includes a first drain bit line 331, that is coupled to the drains of access transistors 301A and 301C, and a second drain bit line 332, which is coupled to the drains of access transistors 301B and 301D. $V_{sub}$ control circuit 250 is coupled to p-well 103.

To read the contents of non-volatile memory cell 300A, a read voltage equal to the $V_{CC}$ supply voltage is applied to word lines 311 and 312, the drain bit line 331 is held at 1.0 Volts and the source bit line 321 is grounded. In addition, $V_{sub}$ control circuit 250 applies a voltage of 0.7 Volts to p-well 103. Under these conditions, read current will flow through storage transistor 302A if this transistor is erased (i.e., stores no negative charge on its floating gate). Conversely, no read current will flow if transistor 302A is programmed (i.e., stores negative charge on its floating gate). As described above, applying a voltage of 0.7 Volts to the p-well advantageously increases read current through transistor 302A.

Also during a read of non-volatile memory cell 300A, a voltage of 0 Volts is applied to word lines 313 and 314. As a result, access transistors 301C and 301D are turned off, such that storage transistors 302C and 302D are not subjected to read conditions.

Also during a read of non-volatile memory cell 300A, the unselected source bit line 322 and the unselected drain bit line 332 are coupled to receive the same 0.7 Volt pulse that is applied to p-well 103. This prevents leakage current in the unselected storage transistors 302B and 302D. Because the source and drain of storage transistor 302B are held at the same voltage, this transistor 302B is not subjected to a read (or disturb) condition.

Figure 4:
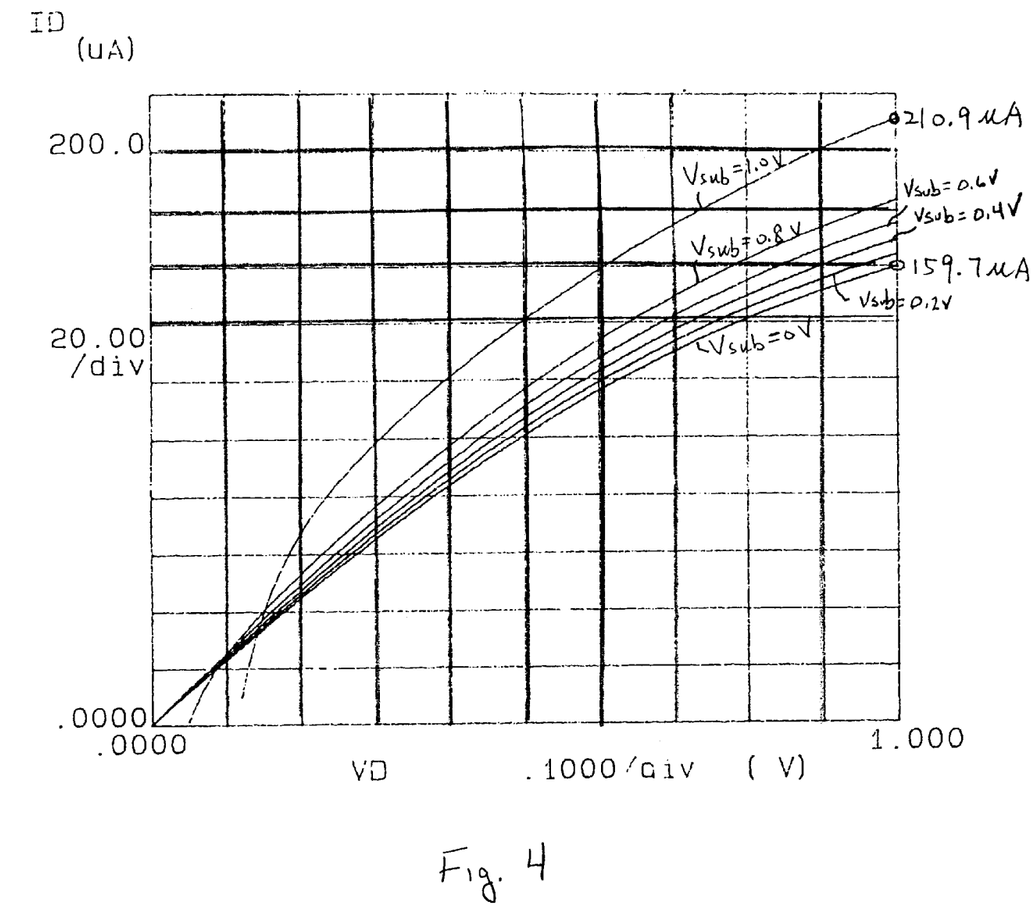
FIG. 4 is a graph of read channel current vs. drain voltage for different substrate biases, wherein the $V_{CC}$ supply voltage is 3.3 Volts.

FIG. 4 is a graph of read channel current (I) vs. drain voltage $V_d$ of storage transistor 302A. In the graph of FIG. 4, the $V_{CC}$ supply voltage is 3.3 Volts. The different lines in FIG. 4 represent substrate bias voltages $V_{BS}$ of 0 Volts, 0.2 Volts, 0.4 Volts, 0.6 Volts, 0.8 Volts and 1.0 Volts. Note that for a drain voltage $V_d$ of 1.0 Volts, the read channel current increases from a value of 159.7 micro-amps with no substrate bias, to a value of 210.9 micro-amps with a substrate bias of 1.0 Volts. The read channel current is therefore increased by 32% in a 3.3 Volt system.

Figure 5:
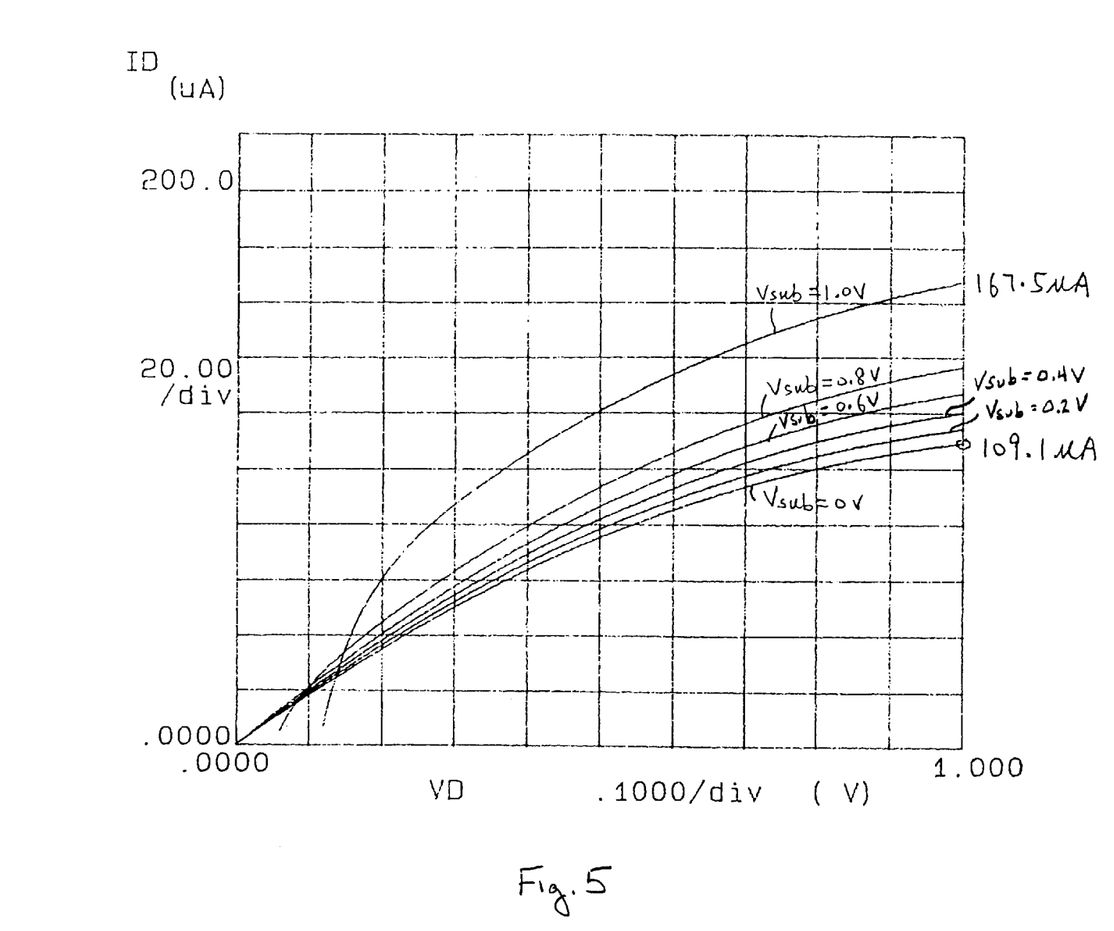
FIG. 5 is a graph of read channel current vs. drain voltage for different substrate biases, wherein the $V_{CC}$ supply voltage is 2.5 Volts.

FIG. 5 is another graph of read channel current (I) vs. drain voltage $V_d$ of storage transistor 302A. In the graph of FIG. 5, the $V_{CC}$ supply voltage is 2.5 Volts. The different lines in FIG. 5 represent substrate bias voltages $V_{BS}$ of 0 Volts, 0.2 Volts, 0.4 Volts, 0.6 Volts, 0.8 Volts and 1.0 Volts. Note that for a drain voltage $V_d$ of 1.0 Volts, the read channel current increases from a value of 109.1 micro-amps with no substrate bias, to a value of 167.5 micro-amps with a substrate bias of 1.0 Volts. The read channel current is therefore increased by 54% in a 2.5 Volt system.

Figure 6:
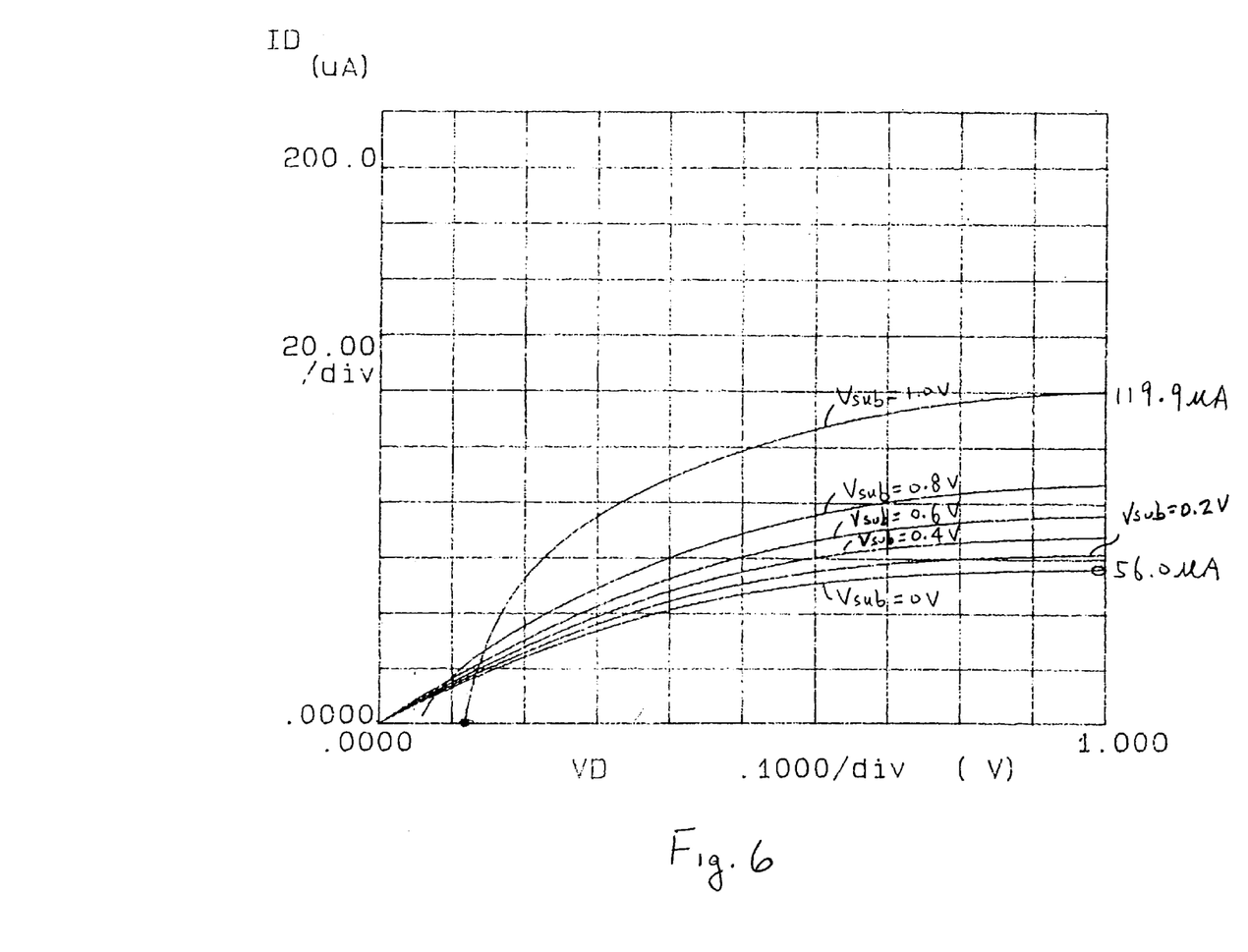
FIG. 6 is a graph of read channel current vs. drain voltage for different substrate biases, wherein the $V_{CC}$ supply voltage is 1.8 Volts.

FIG. 6 is another graph of read channel current (I) vs. drain voltage $V_d$ of storage transistor 302A. In the graph of FIG. 6, the $V_{CC}$ supply voltage is 1.8 Volts. The different lines in FIG. 6 represent substrate bias voltages $V_{BS}$ of 0 Volts, 0.2 Volts, 0.4 Volts, 0.6 Volts, 0.8 Volts and 1.0 Volts. Note that for a drain voltage $V_d$ of 1.0 Volts, the read channel current increases from a value of 56.0 micro-amps with no substrate bias, to a value of 119.9 micro-amps with a substrate bias of 1.0 Volts. The read channel current is therefore increased by 114% in a 1.8 Volt system. The present invention therefore significantly enhances the read channel current at low $V_{CC}$ supply voltages.

Figure 7:
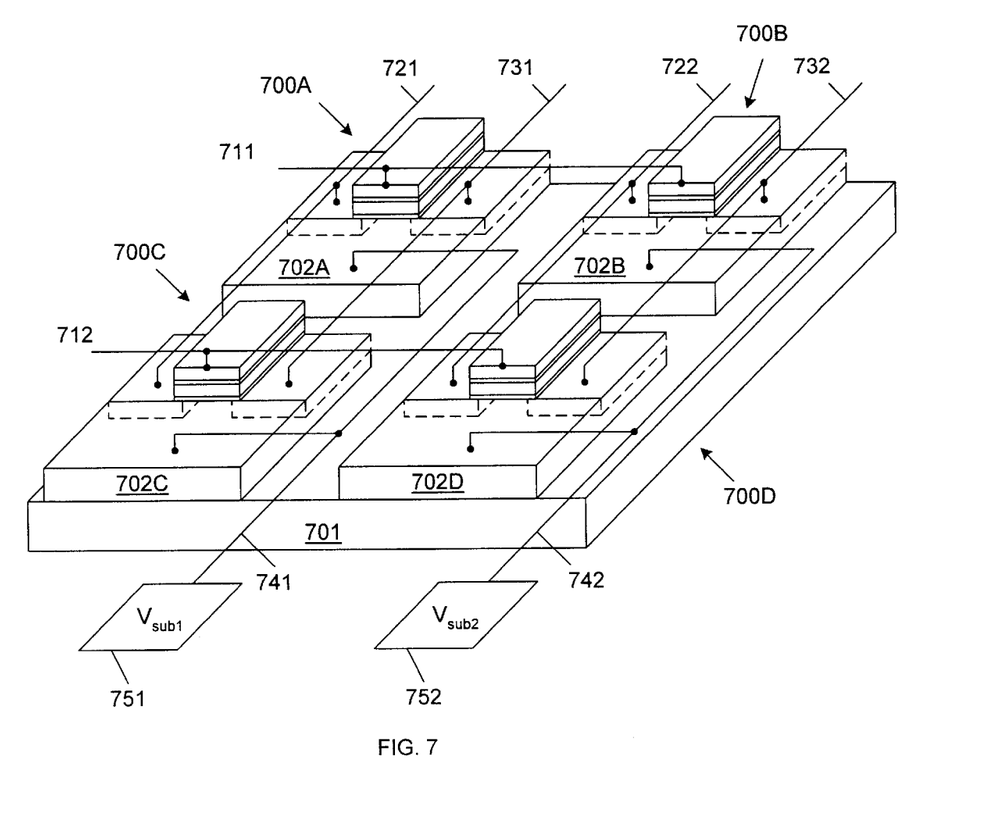
FIG. 7 is an isometric view of a 2×2 array of silicon-on-insulator (SOI) non-volatile memory transistors, which are biased in accordance with another embodiment of the present invention.

The present invention can also be practiced using silicon-on-insulator (SOI) non-volatile memory transistors. FIG. 7 is an isometric view of a 2×2 array of SOI non-volatile memory transistors 700A–700D used in another embodiment of the present invention. SOI non-volatile memory transistors 700A–700D are formed over insulating layer 701 on p-type silicon islands 702A–702D, respectively. Although silicon islands 702A–702D are shown without any insulating material between these islands, it is understood that an insulating material (e.g., silicon oxide) is typically located between these islands. The construction of non-volatile memory transistors 700A–700D within silicon islands 702A–702D is substantially identical to the structure of non-volatile memory transistor 100 (FIG. 1). Word lines 711–712, source bit lines 721–722 and drain bit lines 731–732 connect transistors 700A–700D in the same manner as transistors 100A–100D (FIG. 2). However, line 741 connects p-type silicon islands 702A and 702C. Similarly, line 742 connects p-type silicon islands 702B and 702D. As a result, the substrates of the transistors in each column can be biased independently. Thus, $V_{sub1}$ control circuit 751 is coupled to bias line 741, and $V_{sub2}$ control circuit 752 is coupled to bias line 742. In the array of FIG. 7, only the transistors in the column being read will have substrates biased to 0.7 Volts. The substrates of the transistors in the other column will be biased at 0 Volts.

Thus, to read the contents of non-volatile memory transistor 700A, a read voltage equal to the $V_{CC}$ supply voltage is applied to word line 711, the drain bit line 731 is held at 1.5 Volts, the source bit line 721 is grounded, and substrate bias line 741 is held at 0.7 Volts (by $V_{sub1}$ control circuit 751). Under these conditions, read current will flow through transistor 700A if this transistor is erased. Conversely, no read current will flow if this transistor 700A is programmed.

During a read of non-volatile memory transistor 700A, a voltage of 0 Volts is applied to word line 712. As a result, non-volatile memory transistors 700C and 700D are turned off, such that these transistors are not subjected to a read condition.

Also during a read of non-volatile memory transistor 700A, the substrate bias line 742 associated with the non-selected column is held at 0 Volts (by $V_{sub2}$ control circuit 752). Similarly, the unselected source bit line 722 and the unselected drain bit line 732 are coupled to receive a voltage of 0 Volts. This prevents leakage current in the unselected non-volatile memory transistors 700B and 700D. Additionally, because the source and drain of transistor 700B are held at the same voltage, transistor 700B is not subject to read conditions.

Although the invention has been described in connection with the present embodiment, it is understood that this invention is not limited to the embodiment disclosed, but is capable of various modifications which would be apparent to a person skilled in the art. For example, the conductivity types of the various regions can be reversed, such that p-channel transistors are used rather than n-channel transistors. In such embodiments, the substrate would be an n-well that is biased with a negative voltage during a read operation. In addition, although the present invention has been described with a non-volatile memory array having an AND configuration, the non-volatile memory array can have other configurations (e.g., a NOR configuration) in other embodiments. Thus, the invention is limited only by the following claims.

We claim:

1. A non-volatile memory system comprising:
   an array of non-volatile memory cells fabricated in a substrate, the array being arranged in a plurality of rows and columns, each of the non-volatile memory cells having a source, a drain, a floating gate and a control gate;
   means for biasing the gate of each non-volatile memory transistor in a selected row of the array with a $V_{CC}$ supply voltage during a read operation;
   means for biasing the substrate with a control voltage less than 1.0 Volt and greater than 0 Volts during a read operation;
   means for biasing the source of each non-volatile memory transistor in a selected column of the array with a ground supply voltage during a read operation;
   means for biasing the drain of each non-volatile memory transistor in the selected column of the array with a read voltage between the $V_{CC}$ and ground supply voltages during a read operation; and means for biasing the sources and drains of the non-volatile memory transistors in non-selected columns of the array with the control voltage.

2. The non-volatile memory system of claim 1, wherein the substrate is a first well region of a first conductivity type located in a second well region of a second conductivity type, wherein the second well region is located in a semiconductor region of the first conductivity type.

3. The non-volatile memory system of claim 1, wherein the substrate is located on an insulator.

4. The non-volatile memory system of claim 1, wherein each of the non-volatile memory cells comprises a floating gate transistor.

5. The non-volatile memory system of claim 1, wherein each of the non-volatile memory cells further comprise an access transistor coupled to the floating gate transistor.

6. A method of reading a non-volatile memory transistor in a selected column and a selected row of an array of non-volatile memory transistors fabricated in a substrate, each of the non-volatile memory transistors having a gate, a drain and a source, the method comprising the steps of:

biasing the gate of each non-volatile memory transistor in the selected row of the array with a $V_{CC}$ supply voltage;

biasing the substrate with a control voltage less than 1.0 Volt and greater than 0 Volts;

biasing the source of each non-volatile memory transistor in the selected column of the array with a ground supply voltage;

biasing the drain of each non-volatile memory transistor in the selected column of the array with a read voltage between the $V_{CC}$ and ground supply voltages; and biasing the source and drain of each non-volatile memory transistor in non-selected columns of the array with the control voltage.

7. The method of claim 6, wherein the $V_{CC}$ supply voltage is 3.3 Volts or less.

8. The method of claim 6, wherein the control voltage is about 1.0 Volts.

9. The method of claim 6, further comprising biasing the gates of each of the non-volatile memory transistors in the non-selected rows of the array with a ground supply voltage.

* * * * *